(12) United States Patent
Sucher et al.

(10) Patent No.: US 8,053,324 B2
(45) Date of Patent: Nov. 8, 2011

(54) METHOD OF MANUFACTURING A SEMICONDUCTOR DEVICE HAVING IMPROVED TRANSISTOR PERFORMANCE

(75) Inventors: Bradley D. Sucher, Murphy, TX (US); Christopher S. Whitesell, Garland, TX (US); Joshua J. Hubregsen, Dallas, TX (US); James H. Beatty, Rockwall, TX (US)

(73) Assignee: Texas Instruments Incorporated, Dallas, TX (US)

(*) Notice: Subject to any disclaimer, the term of this patent is extended or adjusted under 35 U.S.C. 154(b) by 599 days.

(21) Appl. No.: 11/832,088

(22) Filed: Aug. 1, 2007
(Under 37 CFR 1.47)

(65) Prior Publication Data

US 2011/0129979 A1    Jun. 2, 2011

(51) Int. Cl.
*H01L 21/331*   (2006.01)
*C23C 16/00*   (2006.01)

(52) U.S. Cl. ........ 438/305; 427/314; 118/715; 118/719; 118/725

(58) Field of Classification Search ................... 438/305; 118/715, 719, 725; 427/314
See application file for complete search history.

(56) References Cited

U.S. PATENT DOCUMENTS

| | | | |
|---|---|---|---|
| 5,411,907 A | 5/1995 | Yoo et al. | |
| 6,235,568 B1 | 5/2001 | Murthy et al. | |
| 6,849,510 B2 | 2/2005 | Lowe et al. | |
| 7,173,296 B2 | 2/2007 | Bu et al. | |
| 7,179,745 B1 | 2/2007 | Waite et al. | |
| 2004/0157183 A1* | 8/2004 | Bernhardt et al. | 432/205 |
| 2005/0191866 A1* | 9/2005 | Powell | 438/791 |
| 2006/0234455 A1* | 10/2006 | Chen et al. | 438/276 |

* cited by examiner

*Primary Examiner* — Ha Tran T Nguyen
*Assistant Examiner* — Aaron Dehne
(74) *Attorney, Agent, or Firm* — Warren L. Franz; Wade J. Brady, III; Frederick J. Telecky, Jr.

(57) ABSTRACT

In one aspect provides a method of manufacturing a semiconductor device having improved transistor performance. In one aspect, this improvement is achieved by conducting a pre-deposition spacer deposition process wherein a temperature of a bottom region of a furnace is higher than a temperature of in the top region and is maintained for a predetermined period. The pre-deposition temperature is changed to a deposition temperature, wherein a temperature of the bottom region is lower than a temperature of the top region.

19 Claims, 9 Drawing Sheets

METHOD OF MANUFACTURING A SEMICONDUCTOR DEVICE HAVING IMPROVED TRANSISTOR PERFORMANCE

TECHNICAL FIELD

The disclosure is directed, in general, to a method of manufacturing a semiconductor device and more specifically to a method of manufacturing a semiconductor device having improved transistor performance by changing deposition parameters of a sidewall spacer layer in a deposition furnace.

BACKGROUND

Sub-micron sized transistors are very well known and are used extensively in all types of electrical devices. It is also well known that these transistors often include deep source/drains and shallower source/drain extensions, that are located adjacent the gate electrodes of the transistors and between which a channel region is formed during an applied voltage. The source/drain extensions are typically formed by placing dopants into a semiconductor substrate through well known processes, such an implantation. The source/drain extensions are implanted immediately adjacent the gate electrodes and are ultimately intended to extend up to, if not slightly extend under, the gate electrode to reduce channel length.

The deeper source/drains, however, are offset from the gate electrodes. This is accomplished typically by using a spacer, which may also be referred to as, a sidewall spacer, an oxide spacer, or gate spacer. The spacer is formed by depositing a spacer layer over the gate electrodes in a deposition furnace, patterning, and etching the spacer layer to form an offset. Implantation processes are then used to implant deep source/drain dopants into the substrate. The spacer partially blocks the implantation of the dopants, and thus, offsets the deep source/drains from the gate electrodes.

Problems can arise, however, in that once implanted, the dopants that form the source/drain extensions are susceptible to moving within the substrate when subjected to high temperatures, such as the temperatures used to deposit the spacer layer. Thus, during the deposition of the spacer layer, the source/drain extension dopants are susceptible to some movement, which can affect channel length. If the movement is significant enough, it can negatively affect transistor performance, particularly as device sizes continue to shrink to 130 nm and below.

SUMMARY

In one embodiment of the invention there is provided a method of manufacturing a semiconductor device. This embodiment comprises forming gate electrodes on semiconductor wafers and forming source/drains extensions adjacent at least a portion of the gate electrodes. The semiconductor wafers are placed in a deposition furnace subsequent to forming the source/drains extensions and a pre-deposition temperature of the deposition furnace is achieved, wherein a temperature at a bottom region of the deposition furnace is about equal to a temperature of a top region of the deposition furnace. The pre-deposition temperature is adjusted such that a temperature of bottom region is higher than a temperature of the top region. These pre-deposition temperatures are adjusted to a deposition temperature wherein a temperature of bottom region is lower than a temperature the top region. A gate spacer layer is deposited over the gate electrodes at the deposition temperature, and the deposition temperature is changed to a post-deposition temperature wherein a temperature of the bottom region is higher than a temperature of the top region. Source/drains are formed adjacent the gate electrodes subsequent to changing the deposition temperature to a post-deposition temperature.

In another embodiment, the invention provides a method of manufacturing a semiconductor device. This method comprises placing semiconductor wafers having gate electrodes located thereon into a deposition furnace and achieving a pre-deposition temperature wherein a temperature of the bottom region is higher than a temperature of in the top region and is maintained for a predetermined period. The pre-deposition temperature is changed to a deposition temperature, wherein a temperature of the bottom region is lower than a temperature of the top region. A gate spacer layer is deposited over the gate electrodes at the deposition temperature.

The invention provides yet another embodiment of a method for manufacturing a semiconductor device. This embodiment comprises forming gate electrodes on semiconductor wafers, forming source/drains extensions adjacent the gate electrodes, and placing the semiconductor wafers in a deposition furnace subsequent to forming the source/drains, wherein portions of the semiconductor wafers reside in a top region, a center region, and a bottom region. The method further includes forming a spacer layer over the gate electrodes by varying a deposition thickness of the spacer layer such that the thickness of the spacer layer on the gate electrodes located in the top region is less than a thickness of the spacer layer located on the gate electrodes in the bottom region.

BRIEF DESCRIPTION OF DRAWINGS

The disclosure is described with reference to example embodiments and to accompanying drawings, wherein.

DETAILED DESCRIPTION

The invention, at least in part, is based on the recognition of problems that arise from the affect that deposition processes used to form spacers adjacent gate electrodes have on the electrical properties of a completed transistor. During these deposition processes, the devices in one region of the furnace, e.g., the top region is exposed to a higher thermal budget than the devices in another region of the furnace, e.g., bottom region. For purposes herein, a thermal budget is the total amount of thermal energy transferred to the wafer during the given elevated temperature operation. Due to the difference in these thermal budgets, dopants that are placed in the semiconductor substrate to form source/drain extensions can move more in the devices that are exposed to higher thermal budgets than those devices exposed to lower thermal budgets during subsequent deposition processes. Thus, the final channel length of these devices can be different, which can cause a variance in an electrical characteristic between the devices, such as operating amperage. Further, as overall device sizes continue to get smaller this dopant movement will have an even greater impact. Thus, it is highly desirable to reduce such variances between devices. The invention, as illustrated by the embodiments discussed herein, addresses this problem.

Figure 1:
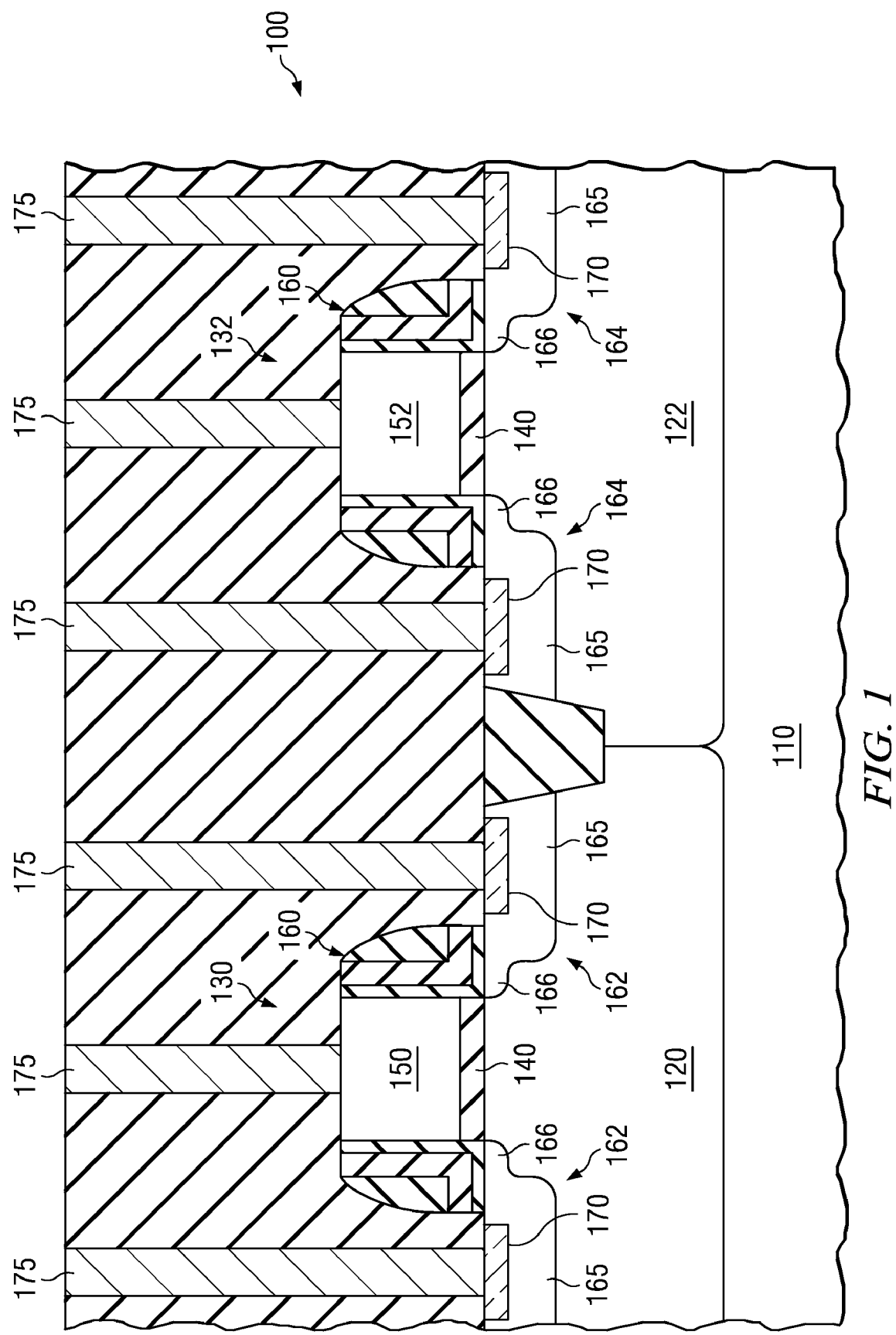
FIG. 1 illustrates a semiconductor device that can be made using the principles of the invention.

FIG. 1 illustrates a view of one embodiment of a semiconductor device 100 that may be made by the various embodiments of the invention. In this embodiment, the semiconductor device 100 is configured as a transistor, though other types of electronic devices may be constructed according to the embodiments described herein. The semiconductor device 100 includes a substrate 110. The substrate 110 may be any known semiconductor material and may be any layer deposited over a semiconductor wafer, such as an epitaxial layer or may be a doped region of a semiconductor wafer. Located within the substrate 110 are well regions 120, 122. In one embodiment, these wells may be complementary wells; for example, well 120 may be a well for an NMOS device and well 122 may be a well for a PMOS device. Located over the substrate 110 and well regions 120, 122 are gate structures 130, 132, which in one embodiment may be a complementary device; for example, gate structure 130 may be an NMOS device and gate structure 132 may be a PMOS device.

The gate structures 130, 132 illustrated in FIG. 1 each include a gate oxide 140 located over the substrate 110, as well as doped gate electrodes 150, 152 located over the gate oxide 140. The gate electrodes 150, 152 may have a variety of thicknesses, for example, a thickness ranging from about 50 nm to about 150 nm is exemplary. In one embodiment, the gate electrodes 150, 152 may comprise an appropriately doped polysilicon that can function as either an NMOS or PMOS device. For example, the gate electrodes 150, 152 may include a dopant or combination of several types of dopants therein. The dopant, such as boron, phosphorous, arsenic or another similar dopant based on whether the semiconductor device 100 is operating as a PMOS device or an NMOS device, is configured to tune the minimum energy required to bring an electron from the Fermi level to the vacuum level, or the so-called work function.

The gate structures 130, 132 may further include conventional gate sidewall spacers 160 flanking both sides of the gate electrodes 150, 152. The gate sidewall spacers 160 in the embodiment of FIG. 1 may each include one or more different layers. For instance, the gate sidewall spacers 160 may also include nitride spacers and sidewall oxides. The gate sidewall spacers 160 may comprise many different types of material and one or more layers.

The semiconductor device 100 illustrated in FIG. 1 additionally includes conventional source/drains 162, 164 located within the substrate 110 and proximate the gate electrodes, 150, 152. The source/drains 162, 164 may include deep source/drains 165, and drain extensions 166 (which may be known as medium doped drains (MDD) or lightly doped drains (LDD)), both of which may be doped with a dopant to correspond to the type of device. For instance, source/drains 162, may be doped with an n-typed dopant, such as arsenic or phosphorous, while source/drains 164 may be doped with a p-type dopant, such as boron. The deep source/drains 165 are typically implanted more deeply and with a higher dosage than the extensions 166. Located within the source/drains 162, 164 are silicided source/drain contact pads 170, on which contact or interconnect structures 175 are located. The silicided source/drain contact pads 170, in one embodiment, may comprise nickel silicided source/drain contact pads. Nonetheless, other silicidation materials could be used to form the silicided source/drain contact pads 170. The silicided source/drain contact pads 170 may have a depth into the source/drains 162, 164 ranging from about 10 nm to about 30 nm, among others.

The distance between the source/drains 162, 164, defines the channel length, which affects the performance of the semiconductor device 100. Thus, if the channel length varies from one device to another, their respective electrical performances will also vary. In manufacturing such devices 100, it is highly desirable to have the operational performance of the devices 100 as uniform as possible from one lot to another.

Figure 2:
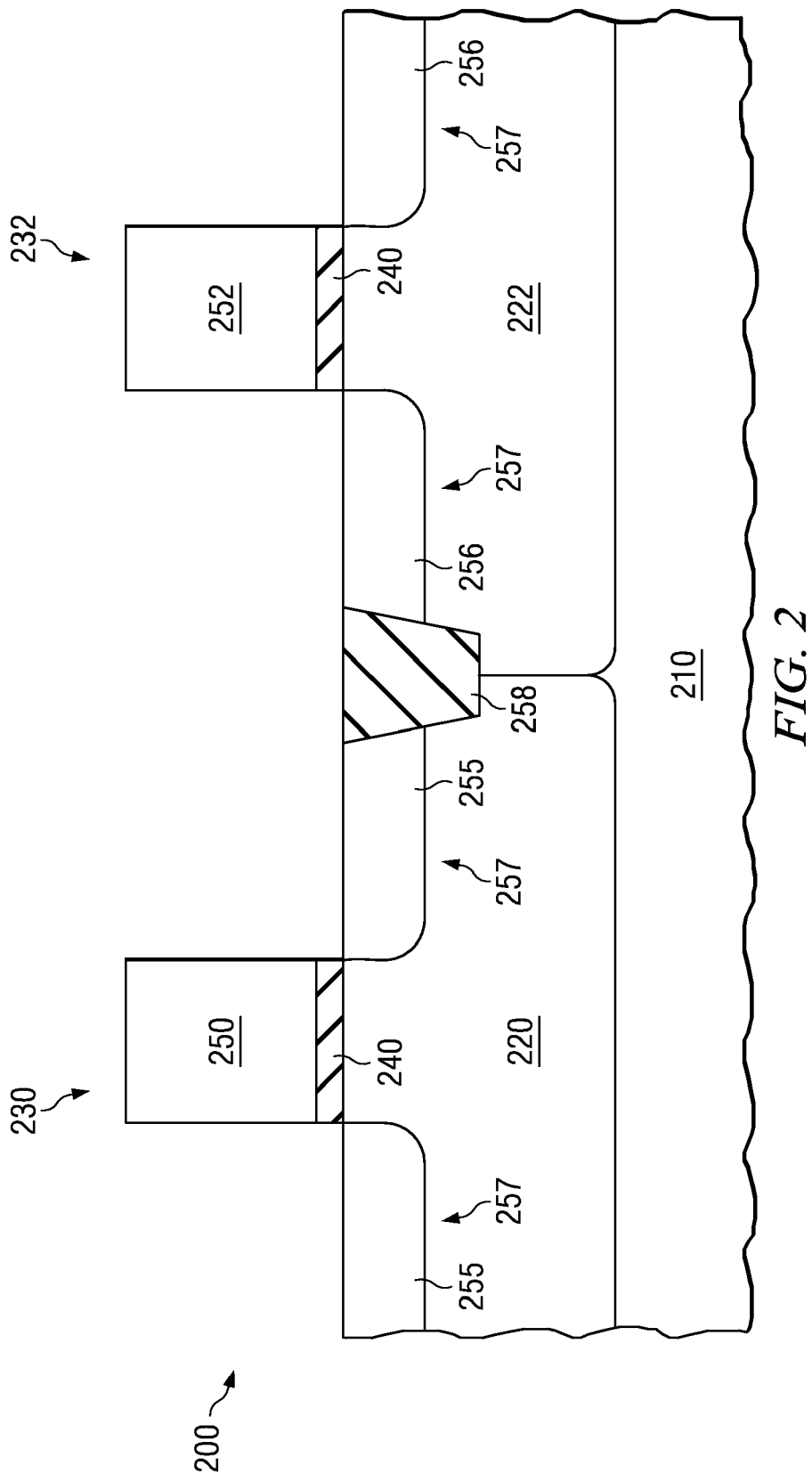
FIG. 2 illustrates a view of the device of FIG. 1 following the formation of source/drain extensions.

FIG. 2 illustrates a manufacturing step instructing how one might, in certain embodiments, manufacture the semiconductor device 100 depicted in FIG. 1. The semiconductor device 200 of FIG. 2 includes a substrate 210, as mentioned above. In the embodiment illustrated in FIG. 2, the substrate 210 is a p-type substrate; however, one skilled in the art understands that the substrate 210 could be an n-type substrate. In such cases, each of the dopant types described throughout the remainder of this document would be reversed. For ease of discussion, no further reference to this opposite scheme will be discussed.

Located within the substrate 210 are conventionally doped wells 220, 222. In one doping scheme, the well region 220 may be doped with a p-type dopant, such as boron, to form the basis of an NMOS or n-channel device, while well region 222 may be doped with an n-type dopant, such as arsenic or phosphorous, to form the basis for a PMOS or p-channel device.

Located over the substrate 210 are gate structures 230, 232, which may be formed using conventional processes. In the illustrated embodiment, the gate structures 230, 232 each include a gate oxide 240 and gate electrodes 250, 252. The gate electrodes may be conventionally formed and fabricated using materials, such as polysilicon, amorphous silicon, or metal, or various combinations of metals, or combinations of any of these materials. The gate oxide 240 may comprise a number of different materials and stay within the scope of the present invention. For example, the gate oxide 240 may comprise silicon dioxide, or in an alternative embodiment comprise a high dielectric constant (K) material.

Following the formation of the gate electrodes 250, 252 and gate oxides 240, source/drain extensions 255, 256, such as those mentioned above, may be conventionally formed in source/drain regions 257 adjacent the gate electrodes 250, 252. As used herein, the extensions 255, 256 are "formed" when the dopants are placed, for example by implantation, into the wells 220, 222, and are considered formed even though the dopants are not activated at this point. As is standard in the industry, the extensions 255, 256 have a dopant type opposite to that of the well region 220, 222 in which they are located and are more lightly doped than later formed deep source/drains, as discussed below. An isolation structure 258, such as a conventional trench isolation structure, is located between the extensions 255, 256.

Figure 3:
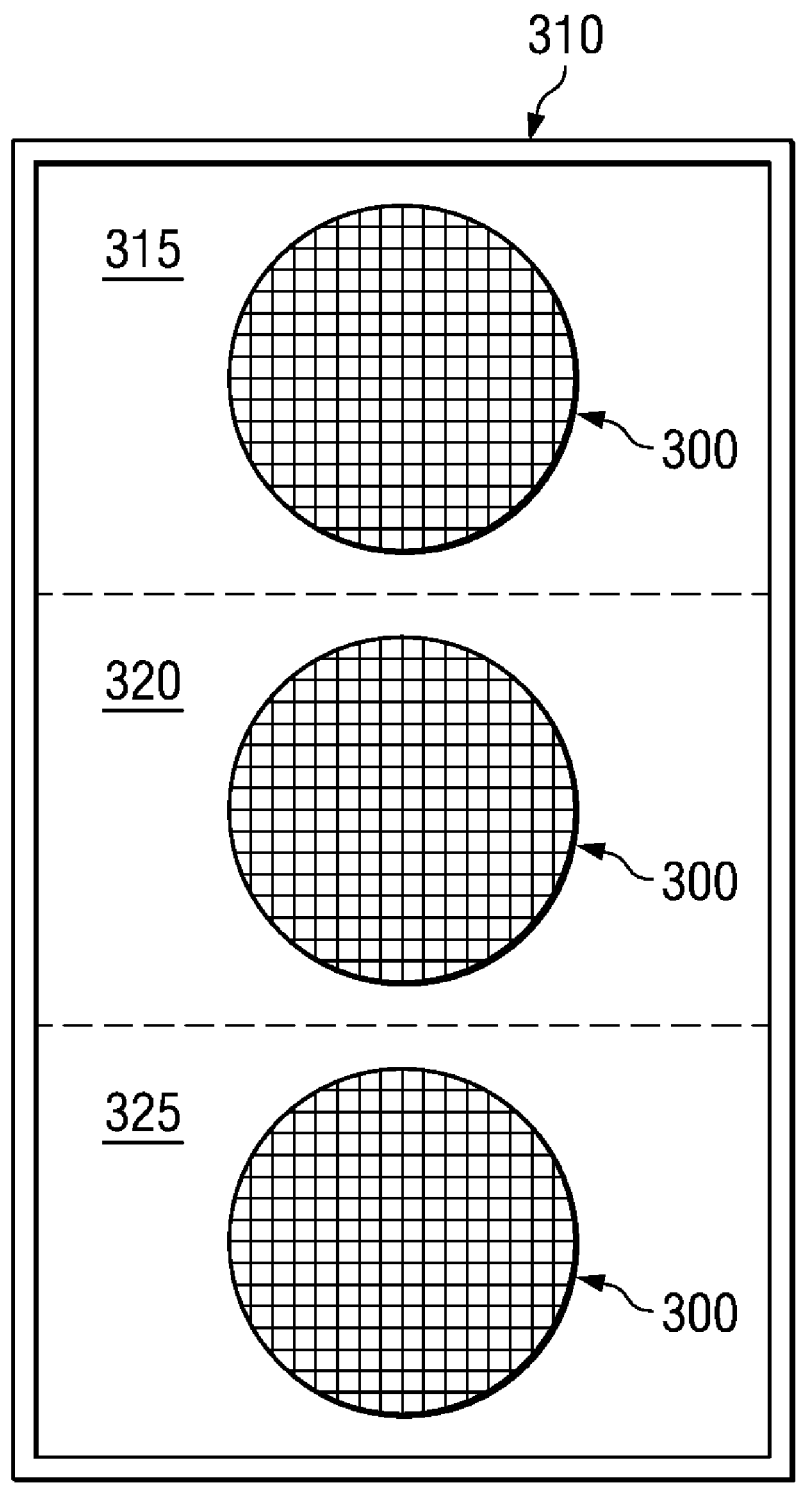
FIG. 3 illustrates a conventional furnace that may be employed in the invention.

Following the formation of the extensions 255, 256, semiconductor wafers 300 having the above-discussed structures located thereon are placed in a deposition furnace 310, as shown in FIG. 3 to form one or more spacer material layers over the electrodes 250, 252. FIG. 3 will be constantly referred to throughout the discussions herein. The furnace 310 may be of conventional design, and in certain configurations, the deposition furnace 310 includes a top region 315, a center region 320, which may include a top center region and a bottom center region (not shown) and a bottom region 325. Multiple heaters are used to control the temperature in the different regions of the furnace 310.

As with all semiconductor manufacturing processes, it is highly desirable to reduce operating variants, such as amperage, between the same devices as much as possible. The invention is based, at least in part, on the recognition that this can be achieved by altering deposition parameters during the formation of spacer layers. The invention provides embodiments that reduce amperage variance using methods that are counter-intuitive to those used in the conventional process discussed below.

Figure 4:
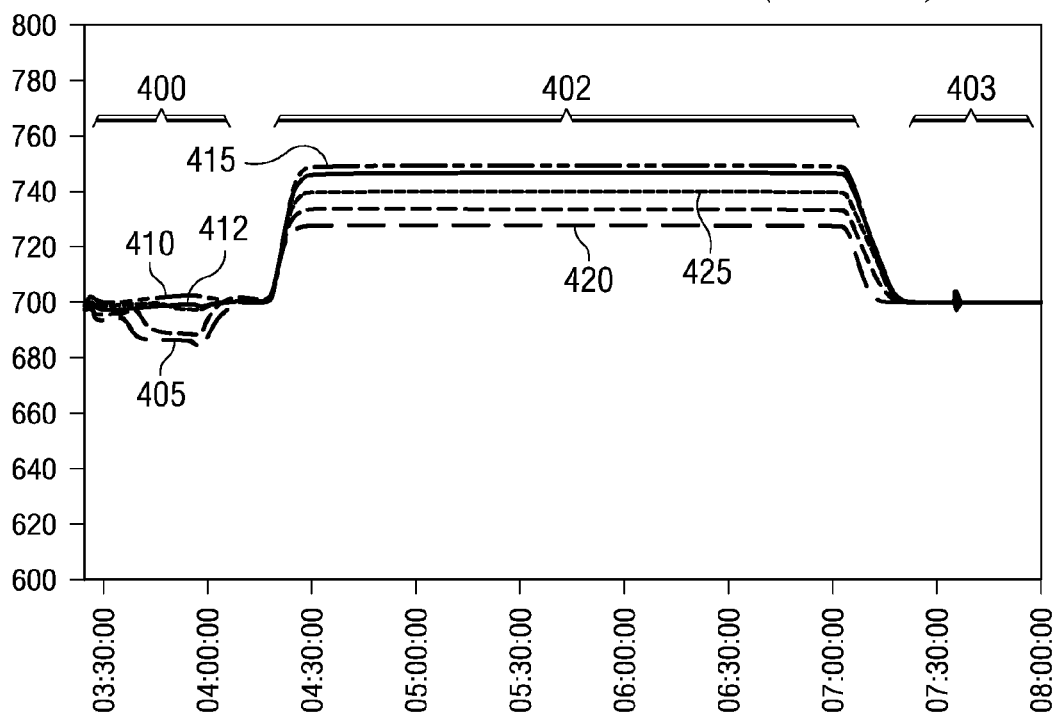
FIG. 4 illustrates a temperature graph of a conventional spacer layer deposition process.

A temperature graph of a conventional deposition process for a spacer nitride layer, is shown in FIG. 4. FIG. 4 illustrates temperature curves during a pre-deposition process 400, a deposition process 402, and a post-deposition process 403, which may be conducted in the furnace 310 of FIG. 3. Though the graph shows curves for the top, top center, center, bottom center and bottom regions, the discussions herein, for simplicity will be limited to the top region, the center region and the bottom region. During pre-deposition process 400 (i.e., before deposition of the material layer begins), the bottom region temperature of the furnace, represented by the curve designated 405, is maintained at a temperature that is below the top region temperature of the furnace, represented by the curve designated 410. The temperature difference between these two regions is usually about 10° C. This temperature difference is maintained until the time at which the temperatures are adjusted to rapidly increase the temperatures (also known as a ramp-up) in all regions of the deposition furnace to the deposition temperatures conducted during the deposition process 402.

During the pre-deposition process 400, the center region temperature of the furnace, represented by the curve designated 412, is at about the same as the top region temperature 410. The pre-deposition process 400 is used to pre-heat the semiconductor wafers prior to ramping-up the temperatures to deposition temperatures. During the pre-deposition process 400, the bottom region temperature 405 is kept below the top region temperature 410 to minimize physical damage to the semiconductor wafers. More specifically, this is done because higher temperatures at this initial stage can cause the semiconductor wafers, particularly those located in the bottom region, to crack or warp. Furthermore, prior to deposition process 402, the pressure within the furnace is typically reduced to a specified deposition pressure, for example about 0.0 Torr. For deposition uniformity purposes, it is highly desirable not to adjust both the temperature and pressure at the same time. Thus, under this conventional approach, it is important to conduct the pre-deposition process 400 at the smaller temperature differentials, as previously discussed.

The pre-deposition process 400 temperatures are ramped-up to the deposition process 402 temperatures such that a top region deposition temperature 415 is greater than a bottom region deposition temperature 420, and a center region deposition temperature 425 is maintained at a temperature that is between these two values. Following the deposition period 402, the temperatures in all regions of the furnace are rapidly decreased, or ramped-back down, to the post-deposition temperatures 403, as shown in FIG. 4.

In this conventional approach, the bottom region temperatures 405, 420 are, on average, maintained below the top region temperatures 410, 415 during pre-deposition process 400 and the deposition process 402. These temperature differentials are required during deposition process 402 because in many deposition furnaces, these temperature differentials must be used to obtain uniform deposition of the spacer layer that is being deposited from one region of the furnace to another. As such, the semiconductor wafers 300 in the top region 315 are exposed to a total higher thermal budget than the semiconductor wafers in the bottom region 325. Due to the higher thermal budget utilized in the top region 315, the dopants in the source/drain extensions 255, 256 in the semiconductor wafers 300 in the top region 315 move more than the dopants in the transistors on the semiconductor wafers 300 in the bottom region 325. This diffusion can shorten the channel length of the devices located in the top region 315, which can ultimately cause the transistors in the top region 315 to have different electrical characteristics, such as operating amperage, than the transistors in the bottom region 325.

Figure 5:
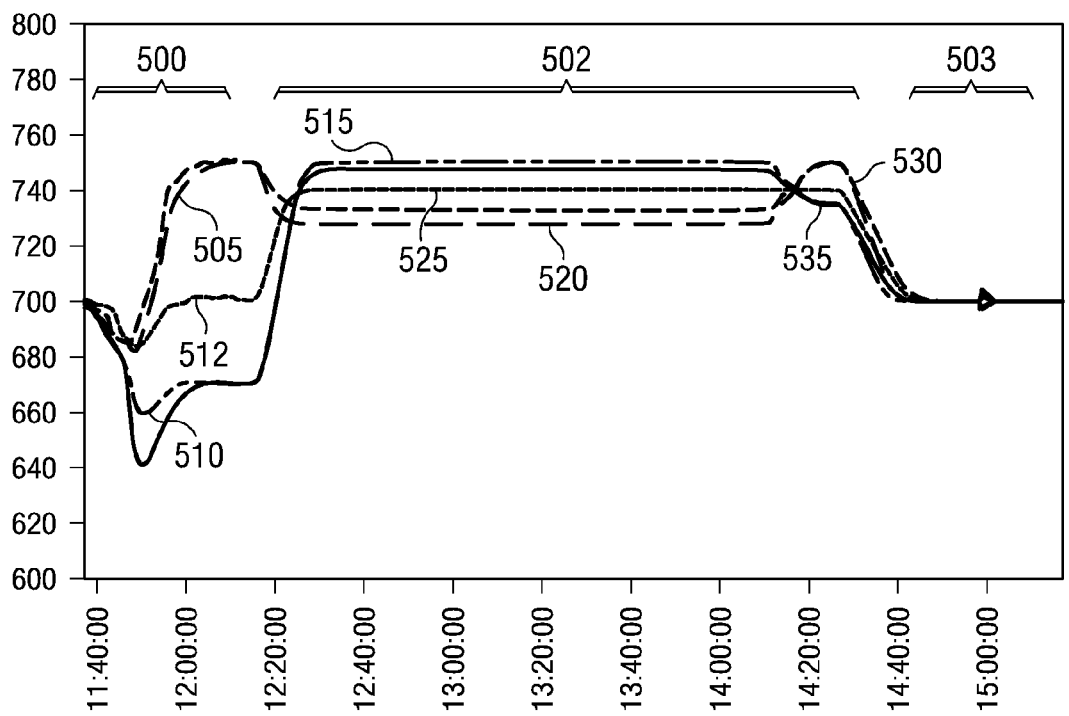
FIG. 5 illustrates a temperature graph of a spacer layer deposition process as covered by an embodiment of the invention.

FIG. 5 shows a temperature graph of a deposition process, as covered by one embodiment of the invention, and that is in stark contrast to the conventional process of FIG. 4. It should be noted that the temperatures and process conditions discussed regarding FIG. 5 are directed to one embodiment and that other temperatures, process conditions, and materials may be used, depending on the deposition furnace and the device being manufactured. FIG. 5 illustrates temperature curves during a pre-deposition process 500, a deposition process 502, and an optional post-deposition process 503, which may be conducted in the furnace 310 of FIG. 3. The embodiment discussed herein relates to the deposition of a silicon nitride layer, however, the invention is not limited to this specific material or deposition conditions. For example, the material could be any material used in the manufacture of a semiconductor device that is deposited in a deposition furnace for similar purposes.

The pre-deposition process 500 is that portion of the process conducted prior to the initial deposition of the target layer (e.g., when the gas or gases from which the layer will be formed are introduced into the furnace and other furnace deposition conditions are met). Post-deposition process 503 is that portion of the process conducted after deposition of the target layer is complete and deposition conditions, as those noted above, are discontinued.

The semiconductor wafers 300 may be positioned in the furnace 310 in a conventional manner. A portion of the semiconductor wafers 310 is placed in the top region 315, the center region 320, which may include top center and bottom center regions that are not shown, and the bottom region 325. The furnace 310 is pumped down or evacuated to a pressure of about 0.0 Torr. The pump-down may occur prior to or during the pre-deposition process 500. During the pre-deposition process 500, the furnace 310 may be heated to an initial temperature ranging from about 680° C. to about 700° C. and nitrogen may be flowed through the furnace during this time. At the initial stage of the pre-deposition process 500, the temperatures achieved in the various regions of the furnace may vary by only about 10 or 15 degrees, and thus, for purposes of discussion herein are considered to be about equal. For example, bottom region temperature curve 505, top region temperature curve 510, and center region temperature curve 512 may range between about 700° C. and 690° C., as seen in FIG. 5, and may be maintained for about 15 minutes. These initial temperature settings may be used to allow the furnace to stabilize before more extreme temperatures are introduced, but in other embodiments, they may be omitted. When used, these initial pre-deposition temperatures are then adjusted such that the bottom region temperature 505 is well above the top region temperature 510, which is contrary to the above-discussed prior art process.

The temperature difference between the bottom and top regions temperatures 505 and 510 may vary but needs to be sufficient to shift the thermal budget to achieve the benefits of the invention, as discussed herein. For example, in one embodiment, the adjusted temperature difference may range from about 50° C. to about 80° C. Thus, in one example, the bottom region temperature 505 may be about 750° C. and the top region temperature 510 may be about 670° C. The center region temperature 512 may be kept approximately constant at around 700° C., as shown in FIG. 5. While the time during which the furnace 310 is maintained at these adjusted pre-deposition temperatures may vary, in one embodiment, they may be maintained for about 30 minutes or more. This temperature inversion shifts the thermal budget such that the dopant diffusion is reduced in those devices located in the top region 310 and increased in those device located in the bottom region 325 when compared with conventional processes. As such, there is less variation in the electrical characteristics between the devices in the top and bottom regions 315 and 325.

This temperature inversion in the pre-deposition process 500 is very much counter-intuitive to the above-discussed conventional process in at least a couple of respects. In one respect, the bottom region temperature 505 is substantially greater than the top region temperature 510. As mentioned above, conventional temperatures are inverse to this due to the concern that wafer cracking or wrapping of the device in the bottom region 325 might occur at the higher temperatures. Thus, those skilled in the art would not be lead to achieve the temperature relationship between the bottom and top region temperatures 505 and 510 of the invention, as illustrated in the embodiment of FIG. 5. In another respect, the temperature may be changed during the pump down or evacuation of the deposition furnace 310. This is also counter-intuitive to the conventional process discussed above, because the temperature inversion might occur during the evacuation of the furnace 310 and two parameters would be changing at the same time. Therefore, in view of the conventional practices, there would be a hesitancy on the part of those skilled in the art to conduct the process, as illustrated in FIG. 5.

The pre-deposition temperatures 505, 510 and 512 are then changed, during the deposition process 502, to the deposition temperatures such that a top region deposition temperature 515 is greater than a bottom deposition temperature 520, and a center region deposition temperature 525 is maintained at a temperature that is between these two values. In certain embodiments, this temperature change will be increased or ramped-up over a short period of time as shown in FIG. 5. During the deposition process 502, as illustrated in the embodiment of FIG. 5, conventional process parameters may be used to flow ammonia ($NH_3$) and dichlorosilane (DCS) in the deposition furnace 310 to form a silicon nitride layer over the gate electrodes 250, 252 (FIG. 2). The deposition is conducted for the appropriate amount of time to achieve the desired layer thickness. At the end of the deposition process 502, the deposition flows are changed to discontinue formation of the spacer layer. Also during the transition between the end of the deposition process 502 and the beginning of the optional post-deposition process 503, the top region deposition temperature 515 is decreased and the bottom region deposition temperature 520 is increased, as shown in FIG. 5.

Following the deposition period 502, the optional post-deposition process 503 may be conducted to help further shift the thermal budget higher in the bottom region 325 of the furnace 310. In the embodiment of FIG. 5, the post-deposition process 503 is utilized. During this segment, the temperatures in the furnace 310 are changed such that a bottom region post-deposition temperature 530 is higher than a top region post-deposition temperature 535. As with the pre-deposition process 502, the amount of temperature variation between the bottom region 325 and the top region 315 may vary. For example, in the illustrated embodiment, the temperature difference between the top and bottom regions 315, 325, may be around 15° C. to 20° C. The optional increase in temperature in the bottom region 325 during the post-deposition process 503 exposes those devices to additional, higher temperatures, thereby further shifting the thermal budget to the device located in the bottom region 325. These temperatures allow the dopants to further diffuse in the devices located in the bottom region 325 of the furnace 310, thereby providing devices in the top and bottom region 315, 325 that have more uniform electrical (e.g. amperage) characteristics. As seen in FIG. 5, the temperatures in all regions of the furnace 310 are then decreased for removal of the semiconductor wafers 300 from the furnace 310.

Figure 6B:
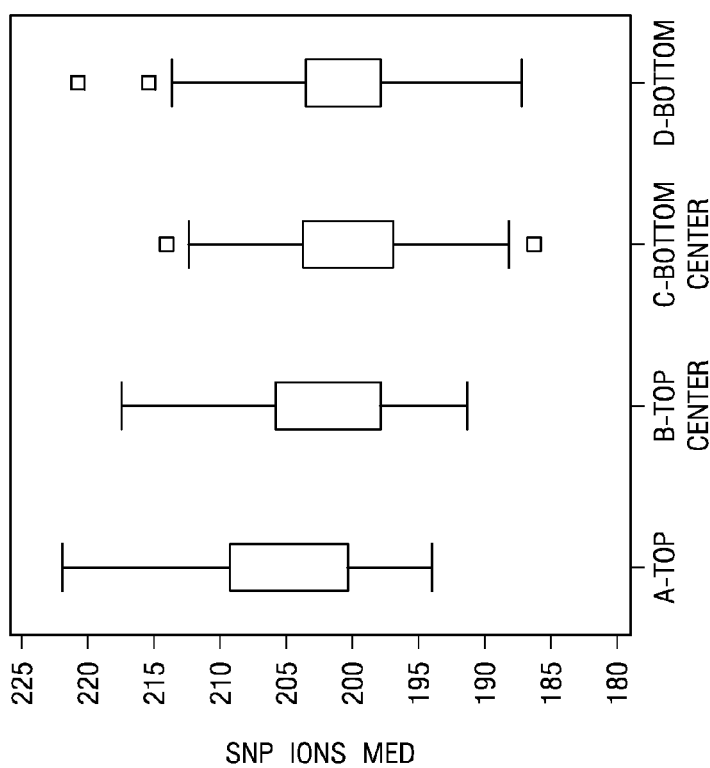
FIGS. 6A-6B illustrate an improvement in microamperage of a device versus it position in a furnace between devices manufactured with a conventional process and devices manufactured in accordance with one embodiment of the invention.
Figure 6A:
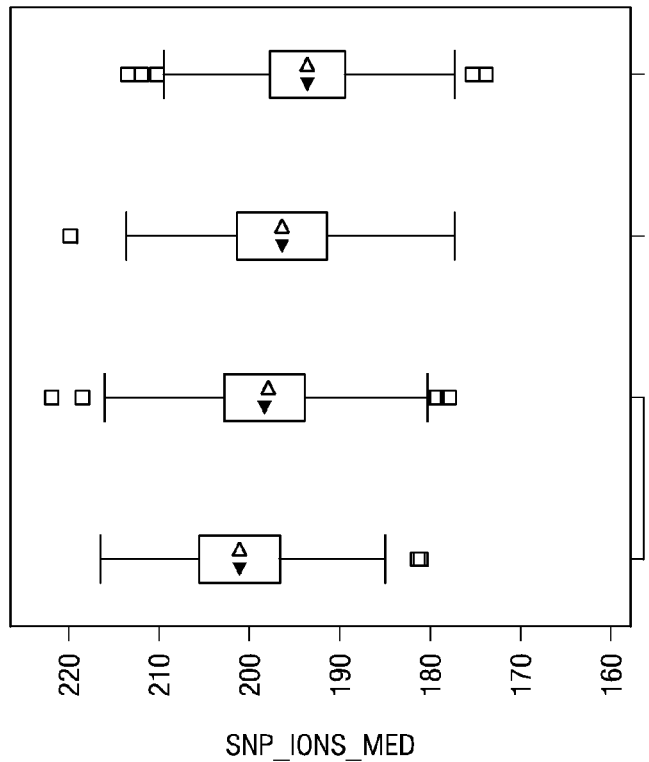

Benefits afforded by embodiments of the invention are seen in the comparison of FIGS. 6A and 6B. FIG. 6A is a graph of the micro-amperage (mA) variation that results from semiconductor wafers being located in different regions of the deposition furnace as conducted using the conventional approach. FIG. 6B is a graph of the improved mA variation that results from semiconductor wafers being located in different regions of the deposition furnace as conducted using the processes of the various embodiments of the invention. In FIG. 6A, the average amount of mA between the semiconductor wafers located in the top region and the bottom region of the furnace is about 7 mA, while in FIG. 6B, the average amount of mA difference between the semiconductor wafers 300 located in the top region 315 and the bottom region 325 of the furnace 310 is about 5 mA. This is an improvement of about 2 mA, which is a desirable degree of improvement and sufficient to increase uniformity between devices manufactured in different regions of the furnace 310. However, it should be noted that in certain wafer lots manufactured, as described above and normalized for thickness, there was as much as a 7 mA improvement obtained over the conventional process for devices located in the bottom region of the furnace 310.

Figure 7A:
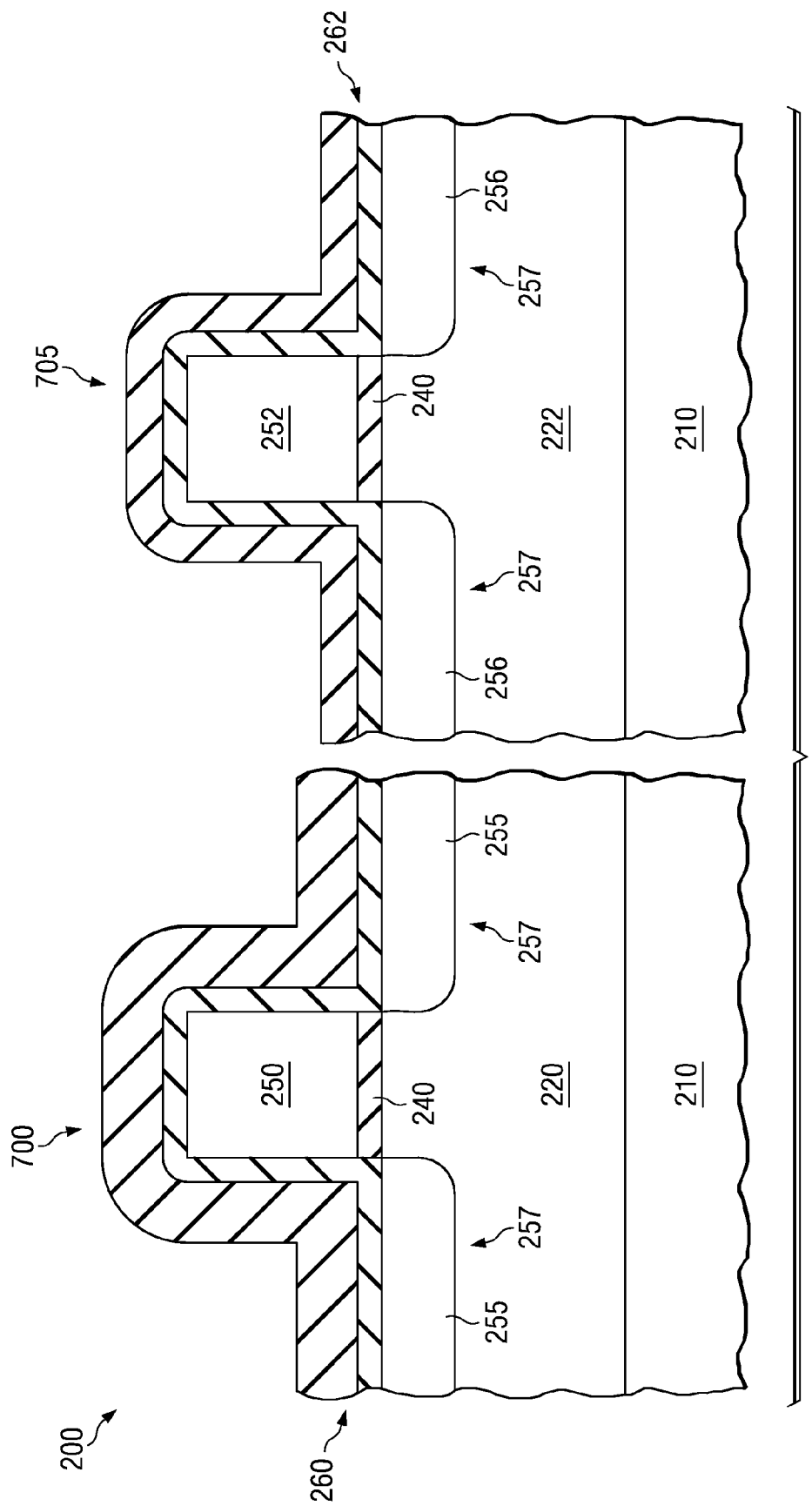
FIGS. 7A-7C illustrate the device of FIG. 2 after deposition of the spacer layer and activation of the deep source/drains and source/drain extensions.

FIG. 7A illustrates another embodiment of the invention and is a side-by-side comparison view of a semiconductor device of FIG. 2. In FIG. 7A, the spacer layer 260 of one such device 700 has been fabricated in the top region 315 of the furnace 310 and the spacer layer 260 of another such device 705 has been fabricated in the bottom region 325 of the furnace 310. As mentioned above, the spacer layer 260 of each of these devices 700 and 705 may be a nitride layer. The nitride layer may be formed in the deposition furnace 310, as discussed above. Conventional materials, such as nitrogen and dicholorsilane, may be used to form the nitride layer.

In this embodiment, the thickness of the nitride layer is not kept uniform throughout the furnace 310, as with conventional processes. Instead, during deposition, process conditions are changed from targeted parameters to cause the thickness of the nitride layer to vary between the top and bottom regions 315, 325 by an amount greater than is attributable to process variation. This thickness difference, which is not to scale, is generally illustrated in FIG. 7A where the spacer layer 260 of device 700 is thicker than the spacer layer 260 of device 705. As used herein, a target parameter is one that is used to produce a substantially uniform nitride layer thickness in all the regions of the furnace. For example, manufacturers typically set temperatures in different regions of the deposition furnace 310 to obtain a substantially uniform thickness (except for minor thickness variations of a few angstroms) of the spacer layer 260 regardless of what region it is in. However, in this embodiment, one or more deposition parameters are changed from the targeted parameter to introduce a thickness variation that is greater than what is attributable to minor process variation. In this embodiment, the furnace 310 may be operated in a manner similar to that shown in FIG. 4, except for the difference discussed herein. In another aspect of this embodiment, however, the furnace 310 may be operated in the manner set forth in FIG. 5, in addition to changing the deposition temperature, thereby further increasing the electrical performance uniformity between device in the top region 315 and the bottom region 325.

In one embodiment, the thickness is varied by setting a deposition temperature differential between the top region 315 and bottom region 325 that is above the typical target temperature differential that would produce a uniform thickness. For example, in certain conventional processes, the targeted temperature differential between the top region 315 and the bottom region 325 required to obtain optimal thickness uniformity may be about 20° C., which may cause the spacer layer thickness in all regions of the furnace 310 to be about 900 angstroms. However, in the embodiments of the invention, the temperature differential might be set to depart from the targeted temperature such that the temperature differential between the top region 315 and the bottom region 325 is about 22° C., or more. This differential can be sufficient to cause non-uniform thickness between top and bottom regions. For instance, and as shown in FIG. 7A, in contrast to a typical uniform thickness of 900 angstroms in all regions, this differential causes a thickness variation of the spacer layer 260 between device 700 and 705. For example, the spacer layer thickness 260 in the device 700 may be about 910 angstroms, while the spacer layer thickness 260 of device 705 may be about 890 angstroms, a difference of about 20 angstroms. The spacer layer thickness 260 (not shown) in the center region 320 may be an average of these two values, which in this example, would be about 900 angstroms.

This embodiment is highly counter-intuitive from that of conventional processes because in conventional processes, manufacturers strive to maintain thickness uniformity of the spacer layer from one region of the furnace to the other. In fact, the top region 315 of the furnace 310 is operated at temperatures higher than the bottom region 325 to promote thickness uniformity between them. Thus, it is believed that one who is skilled in the art would not seek to operate the furnace 310 in the manner set forth in these embodiments.

The variation causes the thickness of the spacer layer 260 located on the gate electrodes 250 of device 700 to be greater than a thickness of the spacer layer 260 located on the gate electrodes 252 of device 705. As explained below, the thicker spacer layer 260 of device 700 lessens the amount of substrate available for deep source drains implantation that follows spacer formation. Thus, though the dopants move further under the gate electrode 250, the effect of this on the electrical properties is, at least, partially offset by the smaller amount of square area, due to the thick sidewall spacer, available for deep source/drain implantation in device 700.

Conversely, for devices 705, though the dopants move less, the effect of this on the electrical properties is, at least, partially offset by the larger amount of square area available, due to the thinner sidewall spacer, for deep source/drain implantation in device 705. These process steps result in devices that have more electrical uniformity between devices fabricated in the top and bottom regions.

Figure 7B:
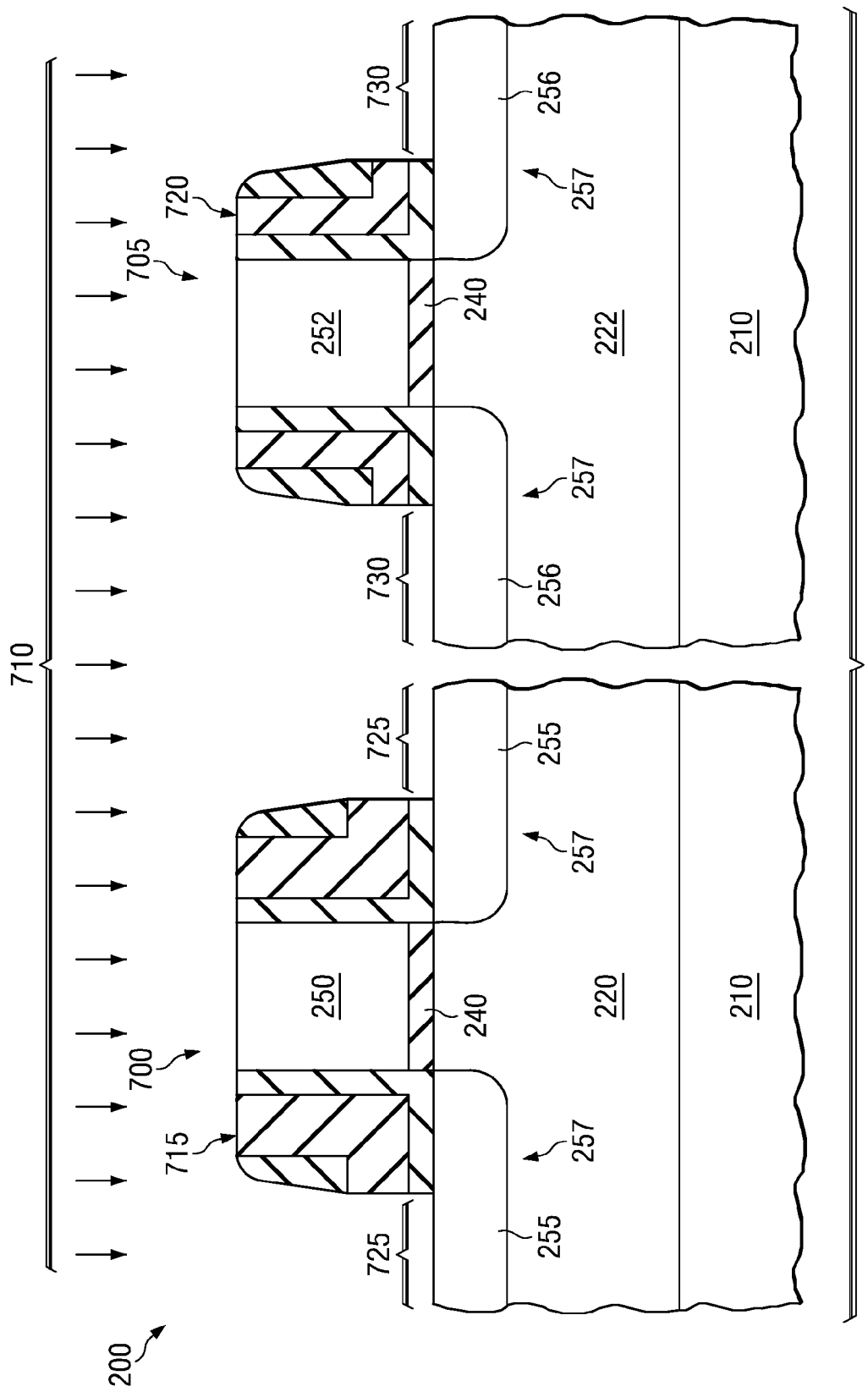
Figure 7C:
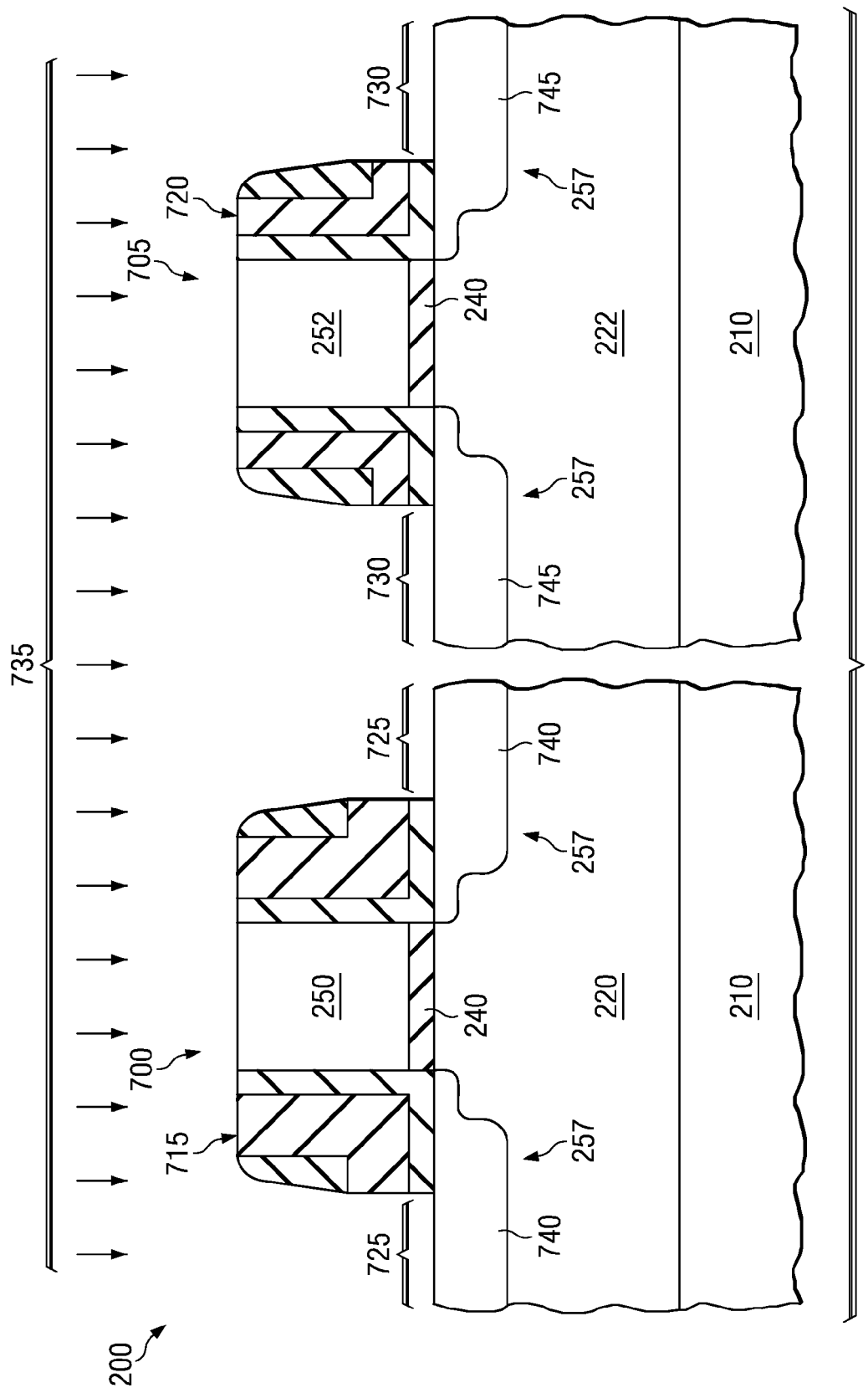

The above mentioned aspects of this embodiment are further illustrated in FIGS. 7B-7C. FIG. 7B illustrates a side-by-side comparison of device 700 and 705 following the deposition of the spacer layers 260 and a sidewall etch process 710. The sidewall etch 710 may be conventional and conducted with a conventional anisotropic etch to remove lateral portions of the spacer layer 260 to form L-shaped sidewall spacers 715, 720 of device 700 and 705, respectively. The difference in the implant areas adjacent each of the electrodes 250, 252 is schematically shown. Areas 725 adjacent the gate electrode 250 of device 700 is smaller than areas 730 adjacent electrode 252 of device 705 due to the variant thickness of the spacer layer, as achieved in the above-discussed manner.

In FIG. 7C, the formation of the sidewall spacers 715, 720 are followed by a conventional deep source/drain implant 735, which forms source/drains 740, 745 adjacent each of the gate electrodes 250, 252, respectively. As with the source/drain extensions, the source/drain 740, 745 are formed when the dopants are placed into the wells 220, 222, and are considered formed even though the dopants are not activated at this point. The deep source/drains have a greater dopant concentration than the previously formed source/drain extensions and are also driven deeper into the substrate. Further, because the sidewall spacers 715 are thinner than the sidewall spacers 720, more area is available for implantation in device 705 than in 700. Thus, the above-discussed effects of the temperature differentials can be offset such that the electrical characteristics between device 700 and 705 are more uniform. Following the formation of source/drains 740, 745, a conventional activation process may be conducted to activate the source/drains 740, 745, including the extensions 255, 256. Other conventional processes may then be conducted to arrive at the device illustrated in FIG. 1.

In other embodiments, the above-discussed thickness variation may be achieved by adjusting one or more deposition parameters, such as gas flows or pressures, or combinations thereof. Given the teachings herein, one skilled in the art would understand how to vary these additional parameters to achieve the thickness variance between the top region 315 and bottom region 325. Moreover, it should also be appreciated that the deposition parameters, including the above-discussed temperature differential, may be varied at the same time to achieve the thickness variation.

Figure 8:
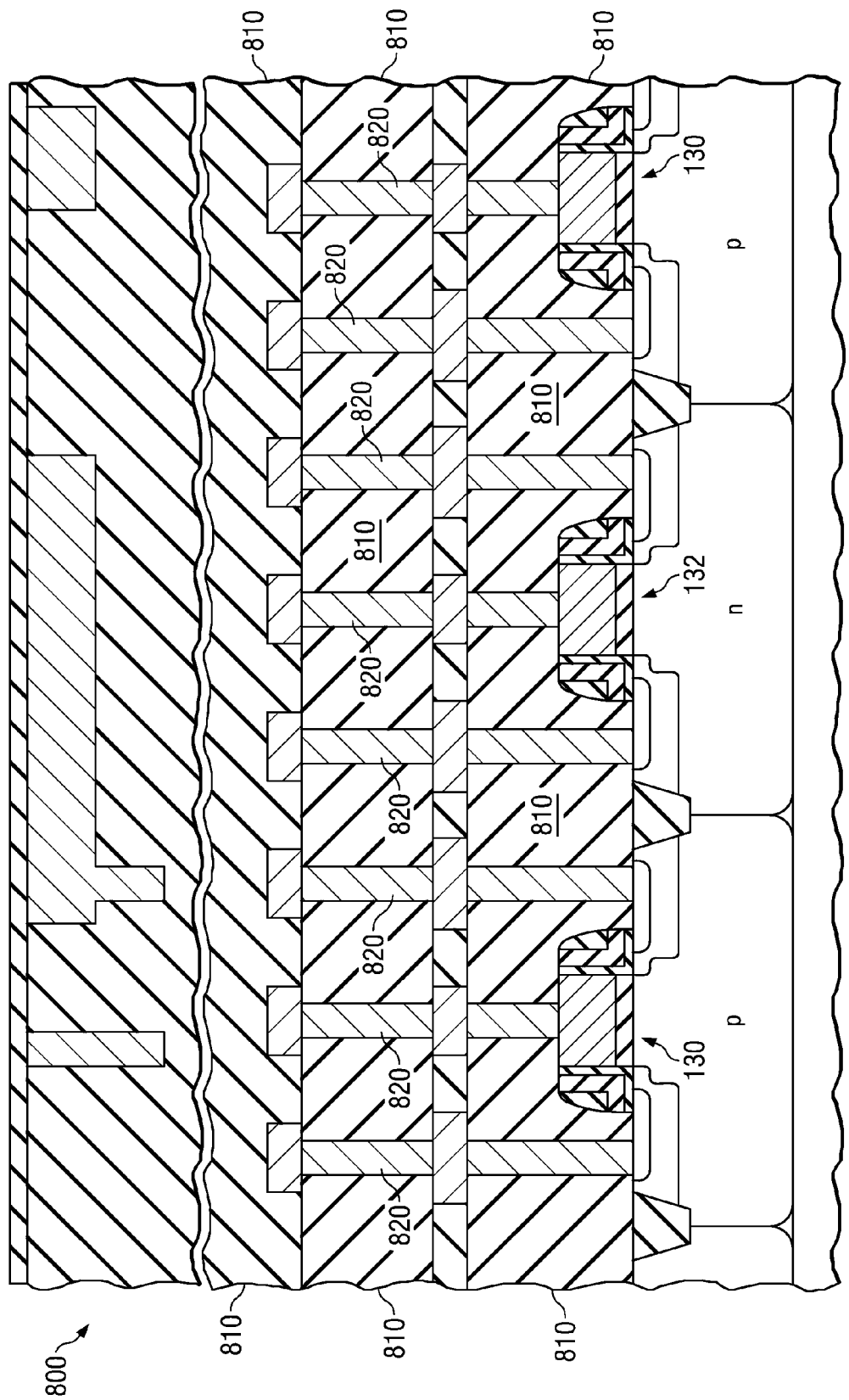
FIG. 8 illustrates a sectional view of an integrated circuit (IC) incorporating the semiconductor device of FIG. 1.

FIG. 8 illustrates the transistors 130, 132 of FIG. 1 incorporated into an integrated circuit (IC) 800. In the illustrated embodiments, the IC 800 includes complementary NMOS transistors 130 and PMOS transistor 132, which may be manufactured as discussed above. Overlying the transistors 130, 132 are dielectric layers 810 that may be conventionally formed, and interconnects 820 that are located over and within the dielectric layer 810. The interconnects 820 may be also be conventional and may include damascene or dual damascene structures, both of which are shown for illustrative purposes.

Those skilled in the art to which the disclosure relates will appreciate that other and further additions, deletions, substitutions, and modifications may be made to the described example embodiments, without departing from the disclosure.

What is claimed is:

1. A method of manufacturing a semiconductor device, comprising:
   forming gate electrodes on semiconductor wafers;
   forming source/drain extensions adjacent the gate electrodes;
   placing portions of the semiconductor wafers in top and bottom regions of a deposition furnace subsequent to forming the source/drain extensions;

achieving a pre-deposition temperature of the deposition furnace, wherein a heated temperature at the bottom region is about equal to a heated temperature at the top region;

adjusting the pre-deposition temperature such that the heated temperature at the bottom region is higher than the heated temperature at the top region for a first time duration;

changing the adjusted pre-deposition temperature to a deposition temperature, wherein the heated temperature at the bottom region is lower than the heated temperature at the top region for a second time duration;

depositing a gate spacer layer over the gate electrodes at the deposition temperature;

changing the deposition temperature to a post-deposition temperature, wherein the heated temperature at the bottom region is higher than the heated temperature at the top region for a third time duration; and forming deep source/drains adjacent the gate electrodes subsequent to changing the deposition temperature to the post-deposition temperature.

2. The method of claim 1, wherein the pre-deposition temperature is adjusted such that the heated temperature at the bottom region differs from the heated temperature at the top region by about 50° C. to 80° C.

3. The method of claim 2, wherein the pre-deposition temperature is adjusted such that the heated temperature at the bottom region is about 750° C. and the heated temperature at the top region is about 670° C.

4. The method of claim 3, further comprising placing a portion of the semiconductor wafers also in a center region of the deposition furnace; wherein achieving the pre-deposition temperature includes a heated temperature at the center region that is about equal to the heated temperature at the top region; and wherein the pre-deposition temperature is adjusted to provide the heated temperature at the center region of the deposition furnace at about 700° C.

5. The method of claim 1, wherein changing the deposition temperature to the post-deposition temperature includes providing a difference between the heated temperature at the bottom region and the heated temperature at the top region of about 20° C.

6. The method of claim 5, wherein changing the deposition temperature to the post-deposition temperature includes changing the heated temperature at the bottom region to about 750° C. and changing the heated temperature at the top region to about 735° C.

7. The method of claim 1, wherein the first time duration is about 30 minutes.

8. A method of manufacturing a semiconductor device, comprising:

placing semiconductor wafers having gate electrodes located thereon into a deposition furnace at top and bottom region locations;

achieving a pre-deposition temperature of the furnace, wherein a temperature of the bottom region is higher than a temperature of the top region and the pre-deposition temperature is maintained for a predetermined period;

changing the pre-deposition temperature to a deposition temperature, wherein the temperature of the bottom region is lower than the temperature of the top region; and depositing a gate spacer layer over the gate electrodes at the deposition temperature.

9. The method of claim 8, wherein, during the predetermined period, a difference between the temperature at the bottom region and the temperature at the top region is about 50° C. to 80°; and the predetermined period is about 30 minutes.

10. The method of claim 9, wherein changing the pre-deposition temperature to the deposition temperature, includes adjusting a temperature of a center region of the deposition furnace to about 700° C.

11. The method of claim 8, further including forming source/drain extensions adjacent the gate electrodes prior to depositing the gate spacer layer; and forming deep source/drains adjacent the gate electrodes subsequent to depositing the gate spacer layer.

12. The method of claim 8, further including changing the deposition temperature to a post-deposition temperature, wherein the temperature of the bottom region is higher than the temperature of the top region.

13. The method of claim 12, wherein, for the post-deposition temperature, a difference between the temperature of the bottom region and the temperature of the top region is about 20° C.

14. The method of claim 13, wherein changing the deposition temperature to the post-deposition temperature includes setting the temperature of the bottom region to about 750° C. and setting the temperature of the top region to about 735° C.

15. The method of claim 8, wherein depositing the gate spacer layer includes forming the gate spacer layer over the gate electrodes by varying a deposition thickness of the gate spacer layer such that the thickness of the gate spacer layer on the gate electrodes located in the top region is less than a thickness of the gate spacer layer located on the gate electrodes in the bottom region.

16. The method of claim 15, wherein varying the deposition thickness includes setting a deposition temperature difference above a targeted temperature difference between the top region and the bottom region.

17. The method of claim 15, wherein adjusting a deposition thickness includes varying a deposition gas flow.

18. The method of claim 15, wherein the thickness is less by about 20 angstroms.

19. A method of manufacturing semiconductor devices, comprising:

forming gate electrodes on semiconductor substrates of first, second and third wafers;

forming source/drain extensions in the substrates adjacent the gate electrodes;

placing the first wafer in a top region, the second wafer in a center region, and the third wafer in a bottom region of a sidewall material layer deposition furnace;

setting the furnace pressure to about 0.0 Torr, and setting the furnace temperature to heat the top, center and bottom regions to an initial temperature of about 680-700° C., with a temperature difference of no more than about 15° C. between regions;

in a pre-deposition process, setting the furnace temperature to change the temperature difference between regions so that temperature in the bottom region exceeds temperature in the top region by about 50-80° C. and temperature in the bottom region exceeds temperature in the center region by a lesser amount, and maintaining the changed temperature difference for about 30 minutes or more;

in a deposition process, setting the furnace temperature to again change the temperature difference between regions so that temperature in the bottom region is less than temperature in the top region and temperature in the center region is between temperature in the top region and temperature in the bottom region;

in the deposition process, flowing ammonia and dichlorosilane in the deposition furnace to form a silicon nitride layer over the gate electrodes;

in a post-deposition process, decreasing temperature in the top region and increasing temperature in the bottom region so that temperature in the bottom region is higher than temperature in the top region by about 15-20° C.; and following the post-deposition process, decreasing temperatures in all regions, and removing the semiconductor wafers from the furnace.

* * * * *